(12) United States Patent
Ueyama

(10) Patent No.: US 6,208,065 B1
(45) Date of Patent: Mar. 27, 2001

(54) PIEZOELECTRIC TRANSDUCER AND ACTUATOR USING SAID PIEZOELECTRIC TRANSDUCER

(75) Inventor: Masayuki Ueyama, Takarazuka (JP)

(73) Assignee: Minolta Co., Ltd., Osaka (JP)

( * ) Notice: Subject to any disclaimer, the term of this patent is extended or adjusted under 35 U.S.C. 154(b) by 0 days.

(21) Appl. No.: 09/289,233

(22) Filed: Apr. 9, 1999

(30) Foreign Application Priority Data

Apr. 15, 1998 (JP) .................................................. 10-119901

(51) Int. Cl.⁷ .............................. H02N 2/00; H01L 41/08
(52) U.S. Cl. ........................ 310/328; 310/311; 310/367; 310/369
(58) Field of Search .................................. 310/311, 328, 310/330–332, 366, 367, 369, 800

(56) References Cited

U.S. PATENT DOCUMENTS

| | | | |
|---|---|---|---|
| 3,781,955 | * | 1/1974 | Lavrinenko et al. ................. 310/328 |
| 4,330,730 | * | 5/1982 | Kurz et al. ............................ 310/331 |
| 4,469,978 | * | 9/1984 | Hamada et al. ...................... 310/366 |
| 4,725,994 | * | 2/1988 | Kaneko et al. ....................... 310/800 |
| 4,879,698 | * | 11/1989 | Langberg .............................. 310/800 |
| 5,118,982 | * | 6/1992 | Inoue et al. .......................... 310/366 |
| 5,153,859 | | 10/1992 | Chatigny et al. .................... 367/140 |
| 5,559,387 | * | 9/1996 | Beurrier ............................... 310/328 |
| 5,589,723 | | 12/1996 | Yoshida et al. ...................... 310/328 |

FOREIGN PATENT DOCUMENTS

| | | | |
|---|---|---|---|
| 57-18641 | | 4/1982 | (JP) ................................ H01B/3/00 |
| 60-162488 | * | 8/1985 | (JP) .................................... 310/367 |
| 63-2198 | | 1/1988 | (JP) .............................. H04R/17/00 |
| 2-58839 | | 12/1990 | (JP) .............................. H04R/17/00 |

\* cited by examiner

*Primary Examiner*—Thomas M. Dougherty
(74) *Attorney, Agent, or Firm*—Sidley & Austin

(57) ABSTRACT

A piezoelectric transducer of a new laminated structure is provided that is easy to fabricate, produces a large amount of motive energy and has high mechanical strength. Electrodes are installed on one of the surfaces of respectively a first and a second piezoelectric element formed in a thin shape, a second piezoelectric element formed without an electrode is laminated onto the top of the surface of the first piezoelectric element having an electrode to form a laminated piece. The laminated piece is wound to form a tube or folded to form a rod. The tube or rod-shaped laminate is then baked and polarized to produce a piezoelectric transducer.

4 Claims, 13 Drawing Sheets

PRIOR ART

PRIOR ART

PIEZOELECTRIC TRANSDUCER AND ACTUATOR USING SAID PIEZOELECTRIC TRANSDUCER

This application is based on patent application No. 10-119901 filed in Japan, the contents of which are hereby incorporated by reference.

BACKGROUND OF THE INVENTION

1. Field of the Invention

The present invention relates to the structure and process of forming of piezoelectric transducer, and an actuator using the piezoelectric transducer.

2. Description of Related Art

Actuators utilizing piezoelectric transducers are highly efficient in converting electrical energy to motive energy, and generating large amounts of motive energy though being compact and lightweight. In addition, the motive energy generated by the piezoelectric transducer can be easily regulated. All of these characteristics make actuators utilizing piezoelectric transducers ideal for use in positioning and moving driven members in cameras, test instruments and other precision equipment.

The piezoelectric transducer which serves as the drive source used in this kind of actuator is comprised of a plurality of piezoelectric elements laminated together. This configuration allows the largest possible physical displacement in the direction of piezoelectric element thickness to be obtained in response to an applied voltage.

FIG. 22(a) is an oblique view showing the external structure of the piezoelectric transducer comprised of a plurality of piezoelectric elements laminated together. A piezoelectric transducer 100 is comprised of a plurality of individual piezoelectric elements 101 each being about 100 micrometers thick and provided on one surface with an electrode 102. Every other electrode 102 (between facing piezoelectric elements) is connected to a line 103 as the positive terminal while the remaining electrodes 102 are connected to the line 104 as the negative terminal as shown in FIG. 22(b). Since the thickness of the piezoelectric transducer changes as a voltage is applied between the positive and negative terminals, the changes in the thickness or displacement can be transmitted through an appropriate means to drive or position the driven member.

FIG. 23 is a cross-sectional view showing the actuator using the piezoelectric transducer comprised of a plurality of piezoelectric element units as described above. FIG. 24 is a cross sectional view showing the friction coupling of the actuator.

In FIG. 23, the reference numeral 111 denotes a frame, 112, 113, 114 are support blocks and 115 is a drive shaft. The drive shaft 115 is supported by the support block 113 and the support block 114 to allow axial movement. One end of the piezoelectric transducer 100 is affixed to the support block 112 and affixed at the other end to the drive shaft 115. The drive shaft 115 is supported to allow axial displacement (direction of arrow a and its opposite direction) in response to displacement in the direction of thickness of the piezoelectric transducer 100.

The drive shaft 115 passes through a slider block 116. An aperture 116a is formed, as shown in FIG. 24, in the lower part of the slider block 116 through which the drive shaft 115 passes and the lower half of the drive shaft 115 is thus exposed. In this aperture 116a, a pad 117 is fitted to engage with the lower half of the drive shaft 115, and a protrusion 117a is formed in the lower section in the pad 117 (See FIG. 24). The protrusion 117a of the pad 117 is pressed upwards by a plate spring 118 and an upward force F is thus applied on the pad 117 to contact the drive shaft 115.

A table 120 for placement of objects is secured to the slider block 116 with machine screws 121.

In the above arrangement, the drive shaft 115 and slider block containing the pad 117 are press-contacted by the force F of the plate spring 118 and friction coupled.

The operation is described next. First of all, when a sawtooth waveform pulse having a gentle rising part and a steep falling part is applied to the piezoelectric transducer 100, the gentle rising part of the drive pulse causes the piezoelectric transducer 100 to elongate, displacing in the direction of thickness, and the drive shaft 115 coupled to the piezoelectric transducer 100 also displaces slowly in the direction of the arrow "a". The slider block 116 at this time friction coupled to the drive shaft 115 moves in the direction of the arrow "a" along with the drive shaft 15 due to the friction coupling force.

The steep falling part of the drive pulse causes the piezoelectric transducer 100 to contract, displacing in the direction of thickness, and the drive shaft 115 coupled to the piezoelectric transducer 100 also displaces swiftly in the opposite direction of the arrow "a". The slider block 116 at this time friction coupled to the drive shaft 115 is effectively stopped in the current position and does not move, due to the cancelling out of the friction coupling force by the inertia of the slider block 116. The slider block 116 and the table attached to the slider block 116 can be moved consecutively in the direction of the arrow "a" by means of consecutive application of drive pulses to the piezoelectric transducer 100.

In order to move the slider block 116 and the table 120 in the opposite of the previous direction (opposite direction of arrow "a"), the sawtooth drive pulse waveform applied to the piezoelectric transducer 100 is changed and a drive pulse consisting of a steep rising part and a gentle falling part can then be applied to achieve movement in the opposite direction.

The above description also effectively takes into account that a sliding motion is added to the friction coupled surfaces between the slider block 116 and the drive shaft 115 whether moving in the direction of the arrow "a" or the opposite direction and objects moving in direction of the arrow "a" are also included due to the difference in drive times.

Among other configurations of the piezoelectric transducer is a piezoelectric transducer formed in hollow tubular shape of a single layer. FIG. 25 is a cross sectional view showing one configuration of the hollow tubular shaped single layer piezoelectric transducer 134. In FIG. 25, an electrode 136 and an electrode 137 are formed on the outer surface of the single layer, hollow tubular piezoelectric transducer 134, and an electrode 138 is formed on the inner surface of the hollow cylinder.

The single layer, hollow tubular piezoelectric transducer 134 is supported by support members 132, 133 installed on the right and left of a mount 131. A slider 135 is friction coupled to the hollow tubular piezoelectric transducer 134 by an appropriate amount of frictional force. A plug 133a is installed to fit in with one end of the piezoelectric transducer 134 and this plug 133a screws into the support member 133 so that the piezoelectric transducer 134 is secured and supported by the mount 131.

In this configuration, a first electrode section comprised of an electrode 136 and an electrode 138; and a second electrode section comprised of an electrode 137 and an electrode 138, are both polarized beforehand in the same radial direction. When sawtooth wave pulses of mutually reverse polarities are applied to the first electrode section and the second electrode section while in this state, an elongation displacement occurs at the first electrode section and a contraction displacement occurs at the second electrode section during the gentle rising part of the sawtooth waveform pulse, and the slider 135 can move in the direction of the arrow "a". Further, on the steep falling part of the sawtooth waveform pulse a sudden contraction displacement occurs at the first electrode section and a sudden elongation displacement occurs at the second electrode section however the inertia of the slider 135 cancels out the force of the frictional coupling with the piezoelectric transducer 134 and there is no sliding movement on their surfaces. Thus by transmitting the movement of the slider 135 to the drive section of a transducer by a suitable means, the positioning and driving of a drive member can be achieved.

The piezoelectric transducer of the conventional art configured as related above with a plurality of laminations of piezoelectric elements was fabricated by means of a complex process consisting of a process to install electrodes in the respective surfaces of the individual piezoelectric elements, a process to bond or adhere the laminations, and a process to wire the electrodes of each layer. These complex processes had the drawback of a high manufacturing cost.

Further, even though the hollow tubular shaped single layer piezoelectric transducer had the characteristic of comparatively high mechanical strength, increasing the intensity of the electrical field was required in order to increase the displacement generated by the piezoelectric element. Accordingly, when there are limitations on the voltage that can be applied to the piezoelectric element, the thickness of the piezoelectric transducer had to be reduced to raise the intensity of the electrical field. In other words, the problem arose that when increasing the displacement generated by the piezoelectric transducer was attempted, the mechanical strength of the piezoelectric transducer declined.

SUMMARY OF THE INVENTION

In view of the above mentioned problems it is therefore a purpose of the current invention to provide a piezoelectric transducer having a new laminated structure, simple to fabricate and yielding a large motive power.

Another object of this invention is to provide a piezoelectric transducer comprising a new laminated structure having adequate mechanical strength even if the thickness of the piezoelectric element is reduced in order to generate a large displacement by increasing the intensity of the electrical field.

Yet another object of this invention is to provide a new process of forming a piezoelectric transducer comprising a new laminated structure, simple to fabricate, thus allowing a drastic reduction in the complex fabrication required in the conventional art such as a process to install electrodes in the respective surfaces of the individual piezoelectric elements, a process to bond or adhere the laminations, and a process to wire the electrodes of each layer.

Other objects of the invention will become clear by the detailed description of the invention while referring to the accompanying drawings.

DETAILED DESCRIPTION OF THE PREFERRED EMBODIMENTS

The embodiments of the present invention will next be described in detail while referring to the accompanying drawings.

First Embodiment

Figure 1:
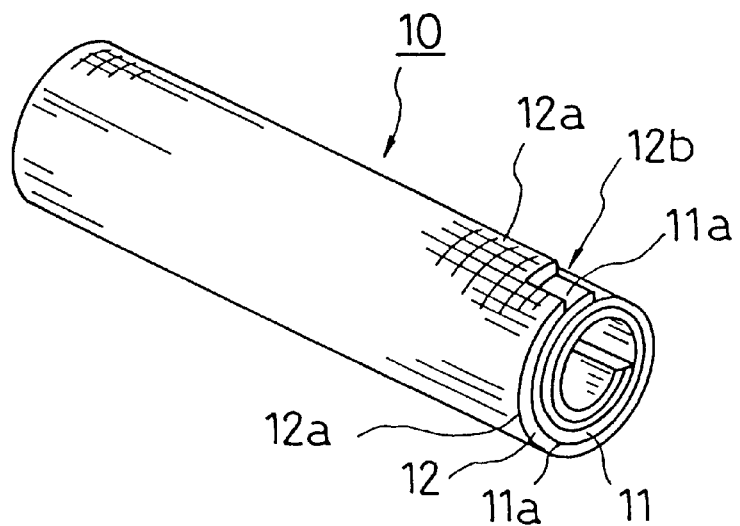
FIG. 1 is an oblique view of the exterior of the piezoelectric transducer of the first embodiment of this invention.
Figure 2:
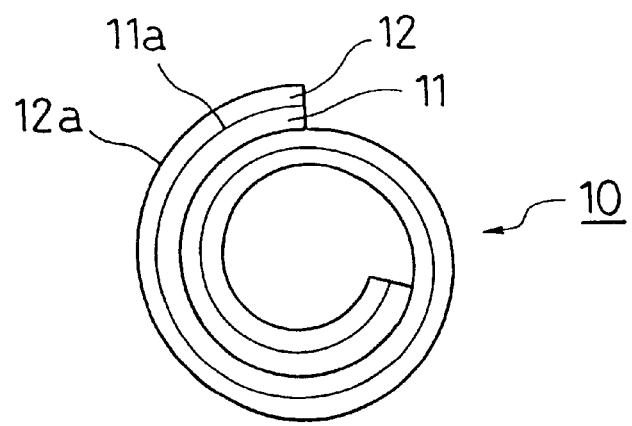
FIG. 2 is a cross sectional view showing the piezoelectric transducer of FIG. 1.
Figure 3:
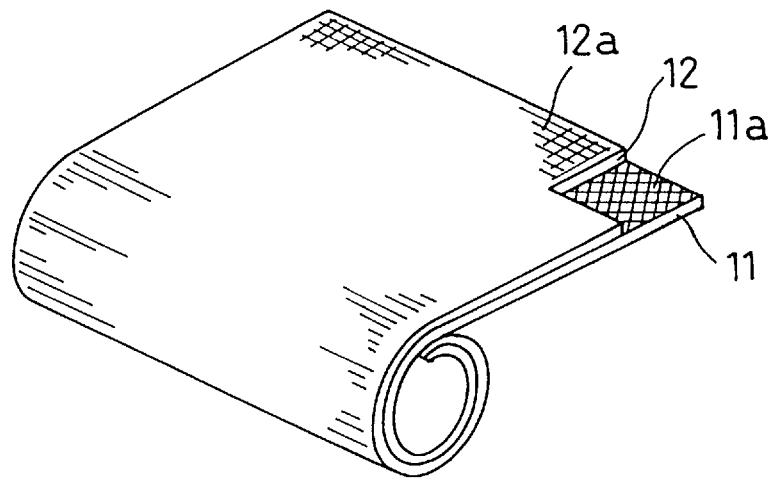
FIG. 3 is an oblique view showing the fabrication process of the piezoelectric transducer of FIG. 1.

The piezoelectric transducer of the first embodiment of this invention is described while using FIG. 1 through FIG. 3. FIG. 1 is an oblique view showing an external view of the piezoelectric transducer. FIG. 2 is a cross sectional view showing the piezoelectric transducer of FIG. 1. FIG. 3 is an oblique view showing the fabrication process of the piezoelectric transducer of FIG. 1.

The piezoelectric transducer as shown in FIG. 3 is first formed with two electrodes 11a and 12a on the respective surfaces of the two thin piezoelectric elements 11 and 12, next the surface of the second piezoelectric element 12 formed without the electrode, is aligned opposite with and laminated on the surface of the first piezoelectric element 11 having the surface electrode 11a, and then formed in a tubular shape as shown in FIG. 1 and FIG. 2.

As shown in FIG. 1, when laid on each other, the end of the second piezoelectric element 12 positioned on the upper side is formed with a notch 12b in order to expose the electrode 11a of the first piezoelectric element 11 positioned on the lower side. This notch 12b allows a wire lead to be connected to the electrode 11a on the lower side of the piezoelectric element 11.

The piezoelectric elements laminated on each other and wound to form a tubular shape are then normalized (baked), wire leads connected to the electrodes 11a and 12a, and when a specific high DC current is applied for polarization, the fabrication of a piezoelectric transducer 10 is complete.

As piezoelectric materials, PZT ($PbZrO_3 \cdot PbTiO_3$) can be used as the main constituents of the piezoelectric elements 11 and 12. Further, it is possible to use inorganic piezoelectric materials as the main constituents of the piezoelectric elements 11 and 12, wherein the inorganic piezoelectric materials can be formed in prescribed shape by baking. A ceramic powder of this type is mixed with solvents, dispersants and plasticizers, and then a blade or similar tool is used to draw out the material to a specified thickness with a uniform surface. When the solvent is dried, a soft material referred to as a green sheet can be obtained. An electrode is formed on the surface of this green sheet by a means such as lithography, a desired shape formed and when normalized (baked) to a specific temperature, a piezoelectric transducer as described above can be obtained.

Figure 4:
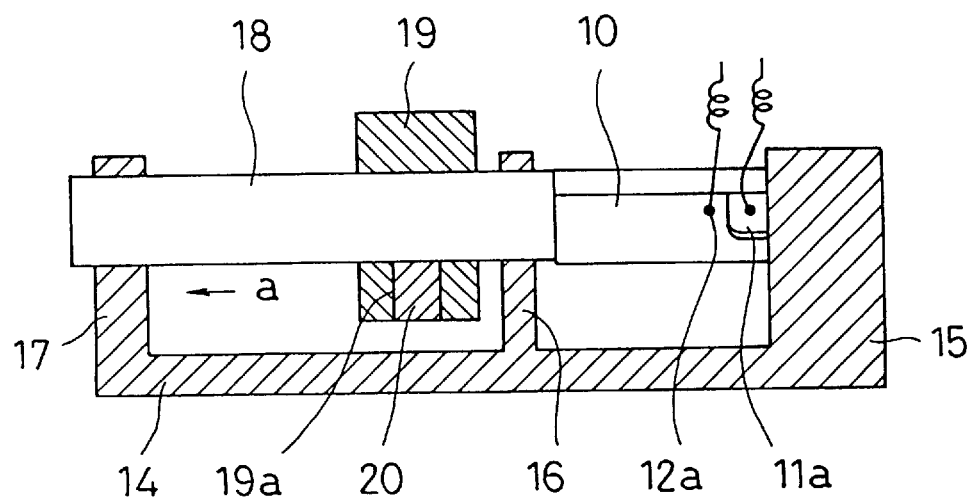
FIG. 4 is a cross sectional view showing the structure of the actuator used in the piezoelectric transducer of FIG.

FIG. 4 is a cross sectional view showing the structure of the actuator used in the piezoelectric transducer of FIG. 1. Here, the reference numeral 14 denotes a mount, 15, 16, 17 are a support blocks, and 18 is a drive shaft. The drive shaft 18 is supported by the support block 16 and the support block 17 to move in the axial direction (direction of arrow "a" or opposite direction) by the axial displacement occurring in the piezoelectric transducer 10.

Here, the reference numeral 10 denotes a piezoelectric transducer formed in a tubular shape of two laminated thin piezoelectric elements as described above. One end of the piezoelectric transducer 10 is secured by bonding to the support block 15 and the other end is secured by bonding to the drive shaft 18.

Figure 24:
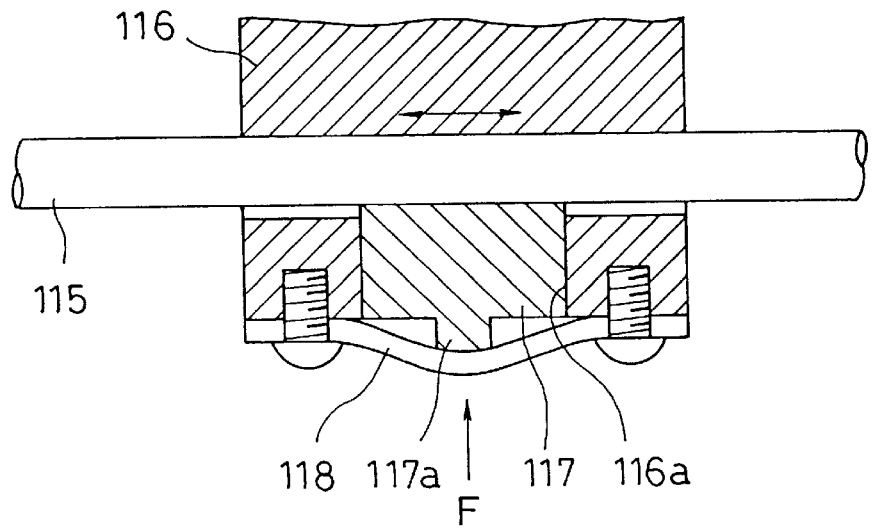
FIG. 24 is a cross sectional view showing the structure of the frictional coupling of the actuator of the conventional art in FIG. 23.

The reference numeral 19 denotes a slider block. This slider block 19 is frictionally coupled by an appropriate amount of frictional force to the drive shaft 18. The frictional coupling is comprised of the same structure as previously described for the example of the conventional art in FIG. 24. In other words, the drive shaft 18 runs through the slider block 19 and an aperture 19a is formed in the lower section of the slider block 19 through which the drive shaft 18 runs and exposes the lower half of the drive shaft 18. Further, a pad 20 is insertably fitted to make contact in the lower half of the drive shaft 18 in the aperture 19a. This pad 20 is pressed upwards by a plate spring not shown in the drawing, the drive shaft 18, slider block 19 and the pad 20 are press-contacted by the force of the spring lever and frictionally coupled by an appropriate amount of frictional force. Further, the slider block 19 is coupled to a driven member such as a table not shown in the drawing.

Figure 23:
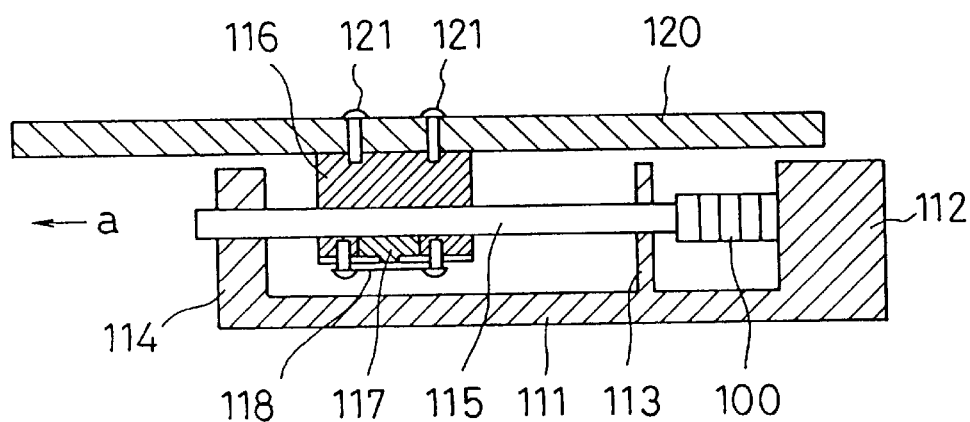
FIG. 23 is a cross sectional view showing the actuator using the piezoelectric transducer of the conventional art comprising a plurality of laminated piezoelectric elements.

This operation is the same for that previously described for the actuator in the example of the conventional art in FIG. 23. When a sawtooth waveform pulse at a frequency of 10 kHz is applied to the electrodes 11a and 12a of the piezoelectric transducer 10, a reciprocating vibration is generated axially at differing speeds in the piezoelectric transducer 10 and the same reciprocating vibration is also generated for the drive shaft 18. By this process, the slider block friction coupled to the drive shaft 18 is moved in the low speed direction of vibration by means of an asymmetrical reciprocal vibration while sliding along the drive shaft and a driven member such as a table coupled to a slider block can therefore be moved.

Second Embodiment

Figure 25:
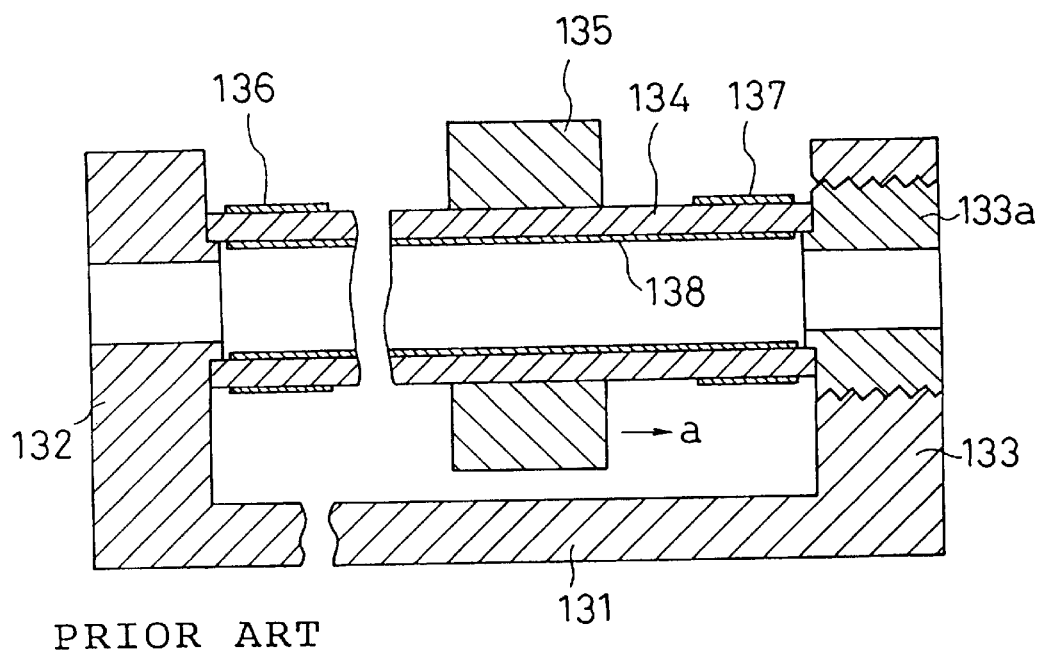
FIG. 25 is a cross sectional view showing a typical structure of the hollow tubular shaped single layer piezoelectric transducer of the conventional art.

The piezoelectric transducer of the second embodiment has functions and configuration that can be substituted for the hollow tubular shaped single layer piezoelectric transducer shown in FIG. 25 as an example of the conventional art.

Figure 5:
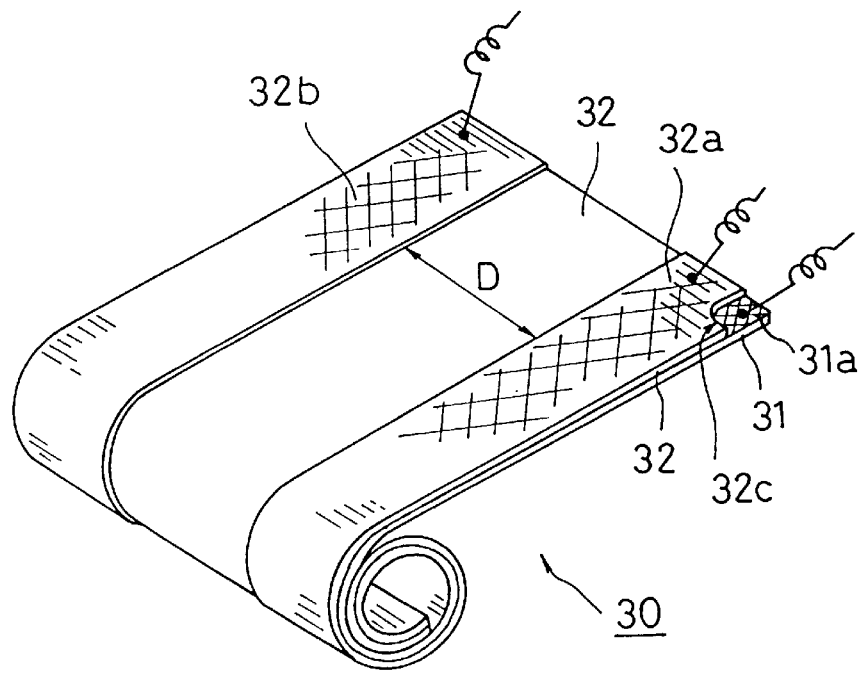
FIG. 5 is an oblique view showing the structure of the piezoelectric transducer of the second embodiment.

FIG. 5 is an oblique view showing the structure of the piezoelectric transducer of the second embodiment. This piezoelectric transducer comprises a lamination of two thin piezoelectric elements 31 and 32 and a portion is wound as shown in the drawing. The finished shape is a hollow tubular shape formed from a plurality of completely wound layers.

A common electrode 31a is formed on the entire surface of the first thin piezoelectric elements 31, and a first electrode 32a and a second electrode 32b are formed at a specified interval D on the surface of the second thin piezoelectric element 32. Next, the non-electrode side of the second piezoelectric element 32 is positioned opposite and laminated on the common electrode 31a of the first thin piezoelectric elements 31 and winding performed in a plurality of wound layers to comprise the hollow tubular shaped piezoelectric transducer 30.

As shown in FIG. 5, a notch 32c is formed on the end of the second piezoelectric element 32 positioned on the upper side during alignment for lamination in order to expose the end of the common electrode 31a of the first piezoelectric element 31 positioned on the lower side. A wire lead can then be connected to the common electrode 31a of the first piezoelectric element 31 on the lower side during alignment for lamination.

The piezoelectric elements configured in a wound tubular shape are normalized (baked), and wire leads connected to the first electrode 32a, the second electrode 32b as well as the common electrode 31a, and when a specified high DC current is applied across the first electrode 32a and common electrode 31a and also across the second electrode 32b and the common electrode 31a, polarization occurs and the fabrication of the piezoelectric transducer 30 is complete.

The material and the fabrication process of the piezoelectric elements 31 and 32 is the same as previously described for the configuration of the first embodiment so the detailed description is omitted here.

Figure 6:
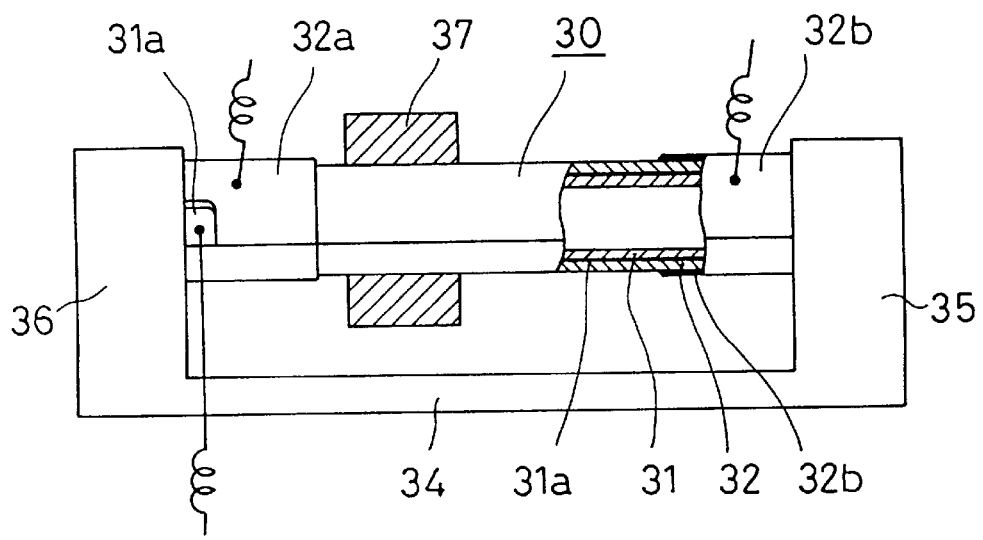
FIG. 6 is a cross sectional view showing the structure of the actuator used in the piezoelectric transducer of FIG. 5.

FIG. 6 is a cross sectional view showing the structure of the actuator used in the piezoelectric transducer shown in FIG. 5. In FIG. 6, the reference numeral 34 denotes a mount, 35, 36 are support blocks and both ends of the above mentioned hollow, tubular shaped piezoelectric transducer 30 are fixedly supported by the support blocks 35 and 36. The technique used for securing and supporting the piezoelectric transducer 30 to the support blocks 35 and 36 is by fitting a plug into the end of the piezoelectric transducer 30 as shown in the previous example in FIG. 25, and screwing the plug into the support member, however other methods can be employed when suitable. A slider 37 is friction coupled on the hollow, tubular shaped piezoelectric transducer 30 by an appropriate amount of frictional force.

In this configuration, when a sawtooth waveform pulse is applied across the common electrode 31a of the surface of the first piezoelectric element 31 and a first electrode 32a of the second piezoelectric element 32 forming a first electrode section, and a sawtooth waveform pulse of reverse polarity is applied across the common electrode 31a of the first piezoelectric element 31 and an electrode 32b of the second piezoelectric element 32 forming a second electrode section, at the gentle rising part of the sawtooth waveform pulse, an elongation displacement is generated at the first electrode section and a contraction displacement is generated at the second electrode section, and the slider 37 can then move in the direction of the arrow "a".

On the steep falling part of the sawtooth waveform pulse, a sudden contraction displacement occurs at the first electrode section and a sudden elongation displacement occurs at the second electrode section however the inertia of the slider 37 cancels out the force of the frictional coupling with the hollow, tubular piezoelectric transducer 30 and there is no sliding movement on their surfaces. Thus by transmitting the movement of the slider 37 to the driven member of a transducer by a suitable means, the positioning and driving of a drive member can be achieved.

This configuration has the advantages that an adhesive bond between the piezoelectric transducer and the drive shaft is unnecessary, assembly is simple, a large mechanical strength is obtained by the fixed support at both ends of the piezoelectric transducer and further that vibration is not prone to occur in a direction perpendicular to the axis. Additional advantages are that increasing the intensity of the electrical field is easy since each electrode in the laminated structure is thin and generating a large displacement is easy to achieve.

Third Embodiment

The piezoelectric transducer of the third embodiment has a structure similar to that previously described for the second embodiment however the structure of the third embodiment is capable of generating a larger axial displacement.

Figure 7:
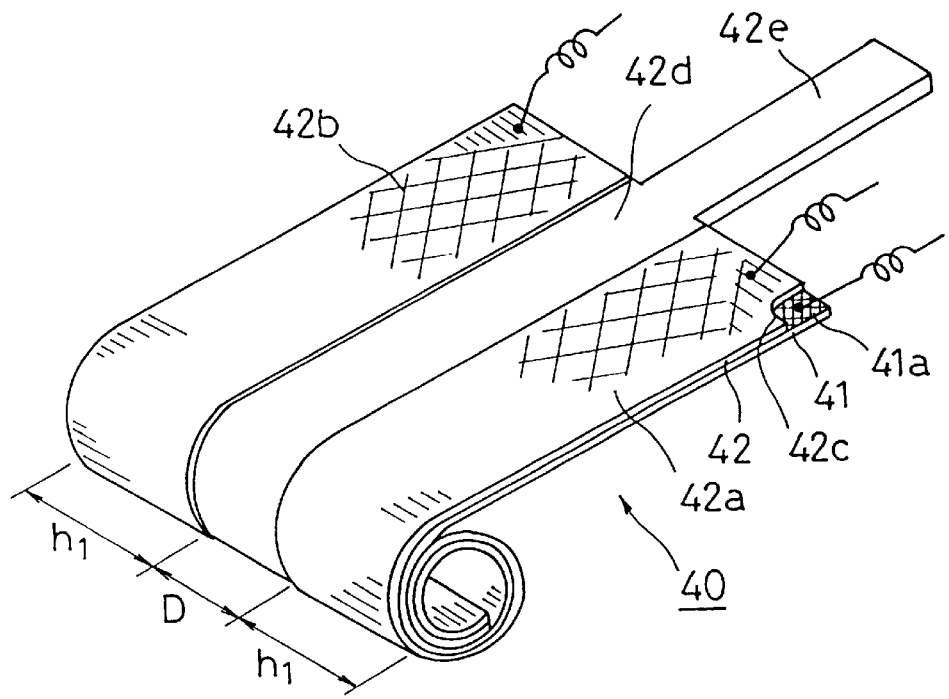
FIG. 7 is an oblique view showing the structure of the piezoelectric transducer of the third embodiment.

FIG. 7 is an oblique view showing the structure of the piezoelectric transducer of the third embodiment. Here, the piezoelectric transducer has a laminated structure comprised of two thin piezoelectric elements 41 and 42 and a portion of the structure in a wound state is shown in FIG. 7. The finished shape is a hollow tubular shape formed from a plurality of completely wound layers.

A common electrode 41a is formed on the entire surface of the first thin piezoelectric element 41, and a first electrode 42a and a second electrode 42b are formed at a specified interval D on the surface of the second thin piezoelectric element 42. Next, the non-electrode side of the second piezoelectric element 42 is positioned opposite and laminated on the common electrode 41a of the first thin piezoelectric elements 41 and winding performed in a plurality of wound layers to comprise the hollow tubular shaped piezoelectric transducer 40.

As shown in FIG. 7, a notch 42c is formed on the end of the second piezoelectric element 42 positioned on the upper side during alignment for lamination in order to expose the end of the common electrode 41a of the first piezoelectric element 41 positioned on the lower side. A wire lead can then be connected to the common electrode 41a of the first piezoelectric element 41 on the lower side during alignment for lamination.

Figure 8:
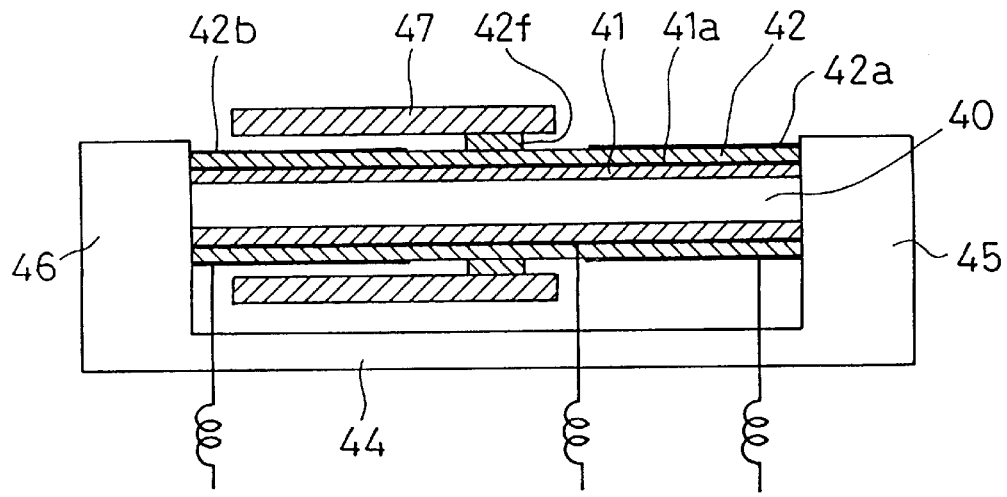
FIG. 8 is a cross sectional view showing the structure of the actuator used in the piezoelectric transducer of FIG. 7.

Further, the widths hi of the first electrode 42a and the second electrode 42b on the surface of the second thin piezoelectric element 42, are the tubular lengths in the axial direction of the first and second electrodes 42a, 42b when the piezoelectric element 41 and 42 were laminated and wound into a hollow tubular shape so that the widths hi can be formed with an electrode width larger than in the configuration of the second embodiment. Also, an extension 42e is formed at the center section 42d where the first and second electrodes 42a, 42b of the second piezoelectric element 42 are not formed, and a large size frictional coupling 42f is formed at the center of the piezoelectric transducer 40 when the piezoelectric elements are wound in the hollow tube shape as shown in FIG. 8. The frictional coupling 42f is the section coupled by frictional force with the slider 47.

The piezoelectric elements configured in a wound tubular shape are normalized (baked), wire leads connected to the electrode 41a, 42a and 42b, and when a specified direct current high voltage is applied across the first electrode 42a and the common electrode 41a and also across the second electrode 42b and the common electrode 41a, polarization is accomplished and the fabrication of the piezoelectric transducer 40 is complete.

The material and the fabrication process of the piezoelectric elements 41 and 42 is the same as previously described for the configuration of the first embodiment so the detailed description is omitted here.

FIG. 8 is a cross sectional view showing the structure of the actuator used in the piezoelectric transducer of the third embodiment. In FIG. 8, the reference numeral 44 denotes a mount, 45, 46 are support blocks and both ends of the above mentioned hollow, tubular shaped piezoelectric transducer 40 are fixedly supported by the support blocks 45 and 46. The technique used for securing and supporting the piezoelectric transducer 40 to the support blocks 45 and 46 is by fitting a plug into the end of the piezoelectric transducer 40 as shown in the previous example in FIG. 25, and screwing the plug into the support member, however other methods can be employed when suitable. A slider 47 is friction coupled by an appropriate amount of frictional force to a large diameter friction coupling 42f formed in the center section of the piezoelectric transducer 40.

In this configuration, when a sawtooth waveform pulse is applied across the common electrode 41a on the surface of the first piezoelectric element 41 and a first electrode 42a of the second piezoelectric element 42 forming a first electrode section, and a sawtooth waveform pulse of reverse polarity is applied across the common electrode 41a of the first piezoelectric element 41 and a second electrode 42b of the second piezoelectric element 42 forming a second electrode section, during the gentle rising part of the sawtooth waveform pulse, an elongation displacement is generated at the first electrode section and a contraction displacement is generated at the second electrode section, and the slider 47 can then move in the direction of the arrow "a".

On the steep falling part of the sawtooth waveform pulse a sudden contraction displacement occurs at the first electrode section and a sudden elongation displacement occurs at the second electrode section however the inertia of the slider 47 cancels out the force of the frictional coupling 42f with the hollow, tubular piezoelectric transducer element 40 and there is no sliding movement on their surfaces. Thus by transmitting the movement of the slider 47 to the driven member by a suitable means, the positioning and driving of a driven member can be achieved.

This configuration, besides the same items mentioned for the second embodiment has the advantages that an adhesive bond between the piezoelectric transducer and the drive shaft is unnecessary, assembly is simple, a large mechanical strength is obtained by the fixed support at both ends of the piezoelectric transducer and a further benefit that vibration is not prone to occur in a direction perpendicular to the axis. Additional advantages are that increasing the intensity of the electrical field is easy since each electrode in the laminated structure is thin and generating a large displacement is easy to achieve.

A still further advantage of this configuration is that a greater width hi can be obtained for the electrodes 42a and 42b than in the second embodiment of this invention, so that the drive is faster since a larger displacement can be obtained from application of the drive pulse voltage.

Fourth Embodiment

The piezoelectric transducer of the fourth embodiment is the hollow tubular piezoelectric transducer as previously described for the second embodiment however the structure is bent in the center so that an elliptical vibration can be generated in the bent section.

Figure 9:
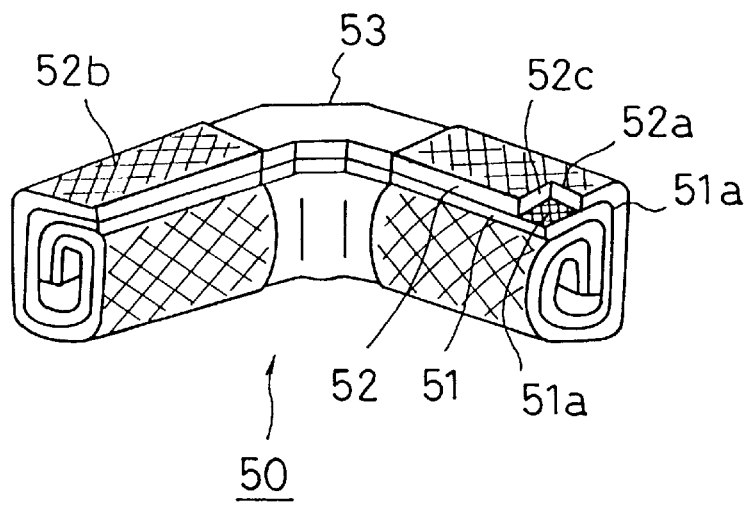
FIG. 9 is an oblique view showing the structure of the piezoelectric transducer of the fourth embodiment.

FIG. 9 is an oblique view showing the structure of the piezoelectric transducer of the fourth embodiment. Here, the piezoelectric transducer has a structure the same as previously described for the second embodiment, and a common electrode 51a is formed on the entire surface of the first thin piezoelectric element 51, and a first electrode 52a and a second electrode 52b are formed at a specified interval on the surface of the second thin piezoelectric element 52. Next, the non-electrode side of the second piezoelectric element 52 is positioned opposite and laminated on the common electrode 51a of the first thin piezoelectric elements 51 and winding performed in a plurality of wound layers to comprise the hollow tubular shaped piezoelectric transducer 50.

As shown in FIG. 9, a notch 52c is formed on the end of the second piezoelectric element 52 positioned on the upper side during alignment for lamination in order to expose the end of the common electrode 51a of the first piezoelectric element 51 positioned on the lower side. A wire lead can then be connected to the common electrode 51a of the first piezoelectric element 51 on the lower side during alignment for lamination.

Next, the piezoelectric element is bent near the center at a bend section 53 to form the shape shown in FIG. 9 and then normalized (baked), and when wire leads connected to the common electrode 51a, a first electrode 52a and a second electrode 52b, a specific high DC current is applied and polarization occurs, the fabrication of a piezoelectric transducer 50 is complete. A suitable means such as press-contact is then used in the bend section 53 to achieve friction coupling to drive the driven member 57 not shown in the drawing (See FIG. 10).

The material and the fabrication process of the piezoelectric elements 51 and 52 is the same as previously described for the configuration of the first embodiment so the detailed description is omitted here.

Figure 10:
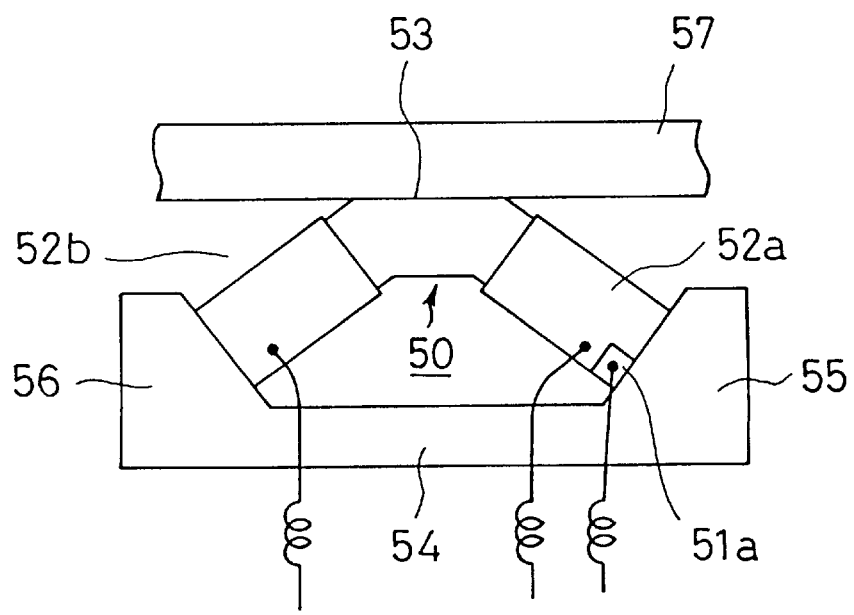
FIG. 10 is a cross sectional view showing the structure of the actuator used in the piezoelectric transducer of FIG. 9.

FIG. 10 is a cross sectional view showing the structure of the actuator used in the piezoelectric transducer of the fourth embodiment. In FIG. 10, the reference numeral 54 denotes a mount, 55, 56 are support blocks and both ends of the above mentioned hollow, tubular shaped piezoelectric transducer 50 are fixedly supported by the support blocks 55 and 56.

In this configuration, when a sine wave voltage of a certain phase is applied across the common electrode 51a on the surface of the first piezoelectric element 41 and a first electrode 52a of the second piezoelectric element 52 forming a first electrode section, and a sine wave voltage of a certain phase of a respectively different polarity is applied across the common electrode 51a of the first piezoelectric element 52 and a second electrode 52b of the second piezoelectric element 52 forming a second electrode section, an elliptical vibration is generated in the bend section 53 of the piezoelectric transducer 50 so that driving of the driven member 57 is accomplished by friction coupling to the bend section 53.

The configuration of the fourth embodiment, just the same as previously described for the second embodiment besides requiring no bond coupling between the drive shaft and the piezoelectric transducer and having a simple assembly process, also has a large mechanical strength by way of the fixed support at both ends of the piezoelectric transducer and the further benefit that vibration is not prone to occur in a direction perpendicular to the axis. Further advantages are that increasing the intensity of the electrical field is simple since each electrode in the laminated structure is thin and generating a large displacement is easy to achieve.

Fifth Embodiment

The piezoelectric transducer of the fifth embodiment is the configuration described for the fourth embodiment achieved in two dimensions.

Figure 11:
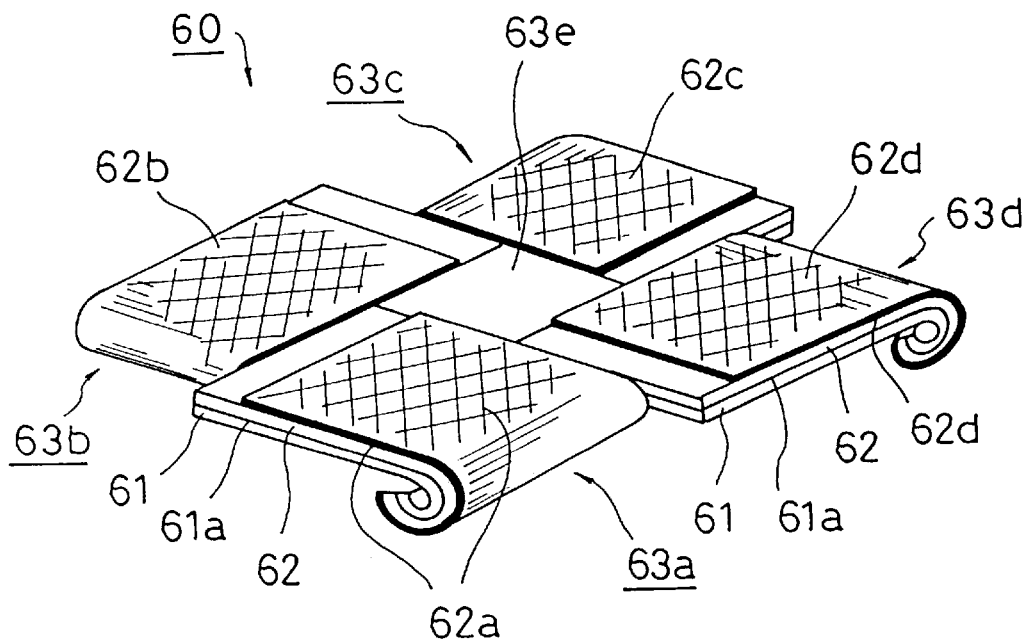
FIG. 11 is an oblique view showing the fabrication process of the piezoelectric transducer of the fifth embodiment.

FIG. 11 is an oblique view showing the fabrication process of the piezoelectric transducer of the fifth embodiment in which a common electrode 61a is installed on the entire surface of the square-shaped first piezoelectric element 61, and the four electrodes consisting of a first electrode 62a, a second electrode 62b, a third electrode 62c and a fourth electrode 62d mutually facing respectively in 90 degree directions are formed on the surface of the second piezoelectric element 62.

Next, the non-electrode side of the second piezoelectric element 62 is made to face and laminated on the common electrode 61a of the first piezoelectric element 61 and formed four elements 63a–63d. Notches are provided between each of the elements 63a, 63b, 63c and 63d. Each of these elements 63a, 63b, 63c and 63d is respectively wound to form four hollow tubular piezoelectric elements 63a, 63b, 63c and 63d at respective 90 degree angles on the same plane. These four hollow tubular piezoelectric elements 63a, 63b, 63c and 63d are joined together at a center section 63e of the piezoelectric transducer 60.

Figure 12:
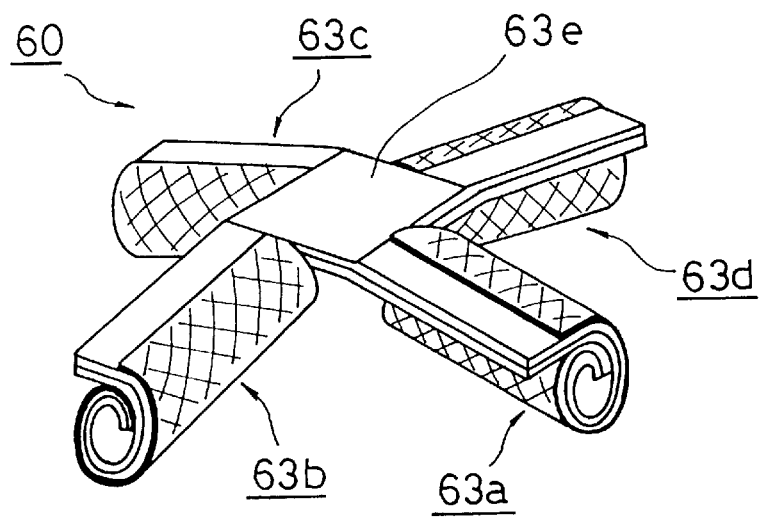
FIG. 12 is an oblique view showing the piezoelectric transducer of FIG. 11.

Next, each of the four hollow tubular piezoelectric elements 63a, 63b, 63c and 63d joined together at the center section 63e, are bent at a specified angle from the center section 63e as shown in FIG. 12. The resulting structure is normalized (baked). Wire leads are connected to the first electrode 62a through fourth electrode 62d, a specified high direct current voltage applied to cause polarization and the fabrication of the piezoelectric transducer 60 is now complete. A driven member 67 not shown in the figure, (See FIG. 13) is friction coupled by a suitable means such as press-contact.

The material and the fabrication process of the piezoelectric elements 61 and 62 is the same as previously described for the configuration of the first embodiment so the detailed description is omitted here.

In this configuration, the four hollow tubular piezoelectric elements 63a, 63b, 63c and 63d are positioned at 90 degree angles from each other on the same surface. In other words, the piezoelectric elements 63a and 63c are positioned along the plane of the X axis and the piezoelectric elements 63*b* and 63*d* are positioned along the plane of the Y axis so that an actuator functioning on the X and Y axes can be obtained.

Figure 13:
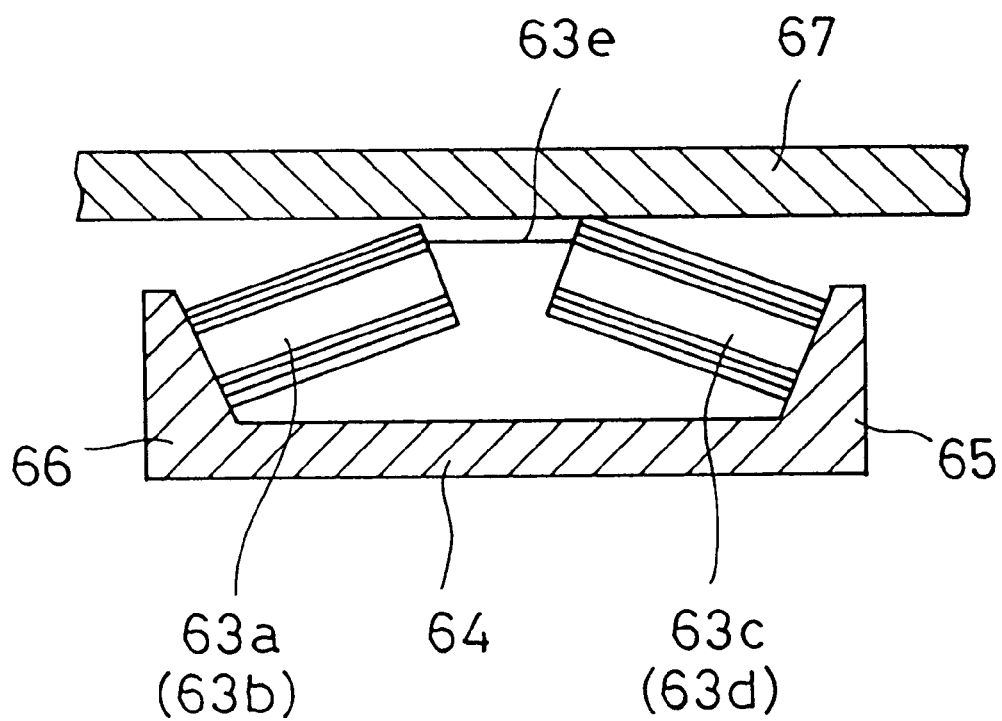
FIG. 13 is a cross sectional view showing the structure of the actuator used in the piezoelectric transducer of FIG. 12.

FIG. 13 is a cross sectional view showing the structure of the XY axis actuator used in the piezoelectric transducer of the fifth embodiment and shows a cross section taken along the X axis. The configuration is exactly the same however for the Y axis direction. In FIG. 13, the reference numeral 64 denotes a mount, and a support blocks 65, 66 are installed at the ends of the X axis. The ends of the piezoelectric elements 63*a* and 63*c* of the piezoelectric transducer 60 are fixedly supported by the support blocks 65, 66. Further, the support blocks 65, 66 are installed on the mount 64, at the ends of the Y axis (not shown in drawing) and fixedly support the ends of the piezoelectric elements 63*b* and 63*d*.

In order to obtain movement along the X axis by drive of piezoelectric elements 63*a* and 63*c*, when a sine waveform voltage of a certain phase is applied to a first electrode section comprised of the common electrode 61*a* and first electrode 62*a* of a piezoelectric element 63*a*, and a sine waveform voltage of a correspondingly different phase is applied to a third electrode section comprised of the third electrode 62*c* and the common electrode 61*a* of a piezoelectric element 63*c*, a vibration is generated in the center section 63*e* of the piezoelectric transducer 60 so that the driven member 67 frictionally coupled to the center section 63*e* is driven in the direction of the X axis.

In order to obtain movement along the Y axis per drive of piezoelectric elements 63*b* and 63*d*, when a sine waveform voltage of a certain phase is applied to a second electrode section comprised of the common electrode 61*a* and the second electrode 62*b* of a piezoelectric element 63*b*, and a sine waveform voltage of a correspondingly different phase is applied to a fourth electrode section comprised of the fourth electrode 62*d* and the common electrode 61*a* of a piezoelectric element 63*d*, a vibration is generated in the center section 63*e* of the piezoelectric transducer 60 so that the driven member 67 frictionally coupled to the center section 63*e* is driven in the direction of the Y axis.

The configuration of the fifth embodiment, just the same as previously described for the second embodiment, besides requiring no bond coupling between the drive shaft and the piezoelectric transducer and having a simple assembly process, also has a large mechanical strength by way of the fixed support at both ends of the piezoelectric transducer and the further benefit that vibration is not prone to occur in a direction perpendicular to the axis. Further advantages are that increasing the intensity of the electrical field is simple since each electrode in the laminated structure is thin and generating a large displacement is easy to achieve.

Sixth Embodiment

In contrast to the first through fifth embodiments in which the first thin piezoelectric element and the second thin piezoelectric element were laminated together and then wound, the piezoelectric transducer of the sixth embodiment has a structure in which the first thin piezoelectric element and the second thin piezoelectric element were laminated and then folded.

Figure 14:
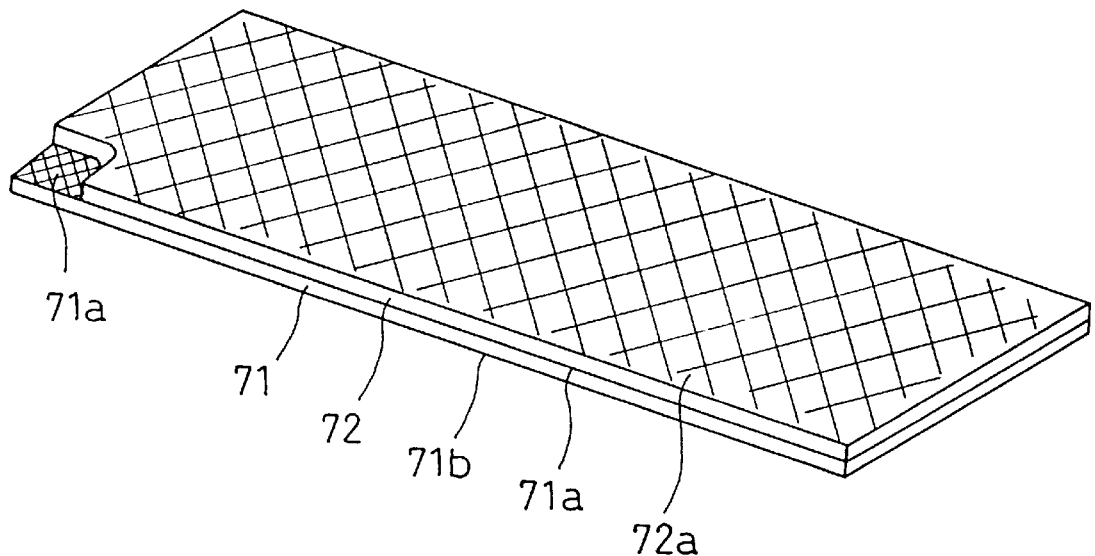
FIG. 14 is an oblique view showing the structure of the laminated piezoelectric element of the sixth embodiment.

In other words, an oblique view in FIG. 14 shows the laminated structure of the first thin piezoelectric element and the second thin piezoelectric element. In FIG. 14, a common electrode 71*a* is formed on the upper surface of the first thin piezoelectric element 71 and further, an electrode 71*b* is formed on the lower surface of the piezoelectric element 71. An electrode 72*a* is formed on the upper surface of the second thin piezoelectric element 72. The non-electrode side of the piezoelectric element 72 faces the common electrode 71*a* of piezoelectric element 71 and is laminated and bonded on the piezoelectric element 71.

Figure 15:
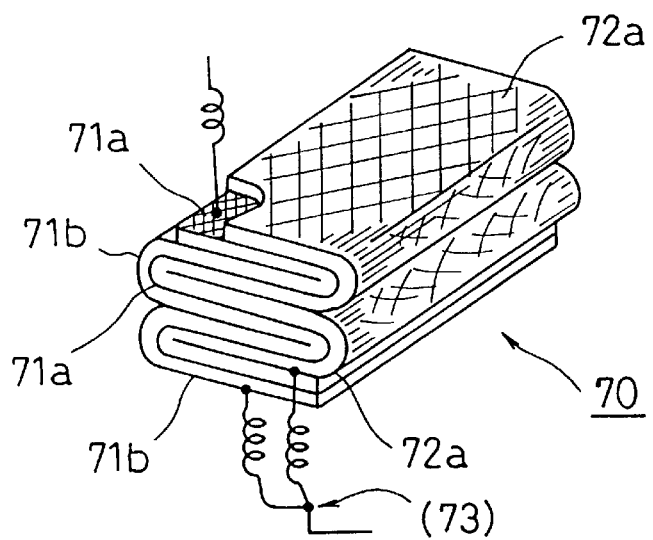
FIG. 15 is an oblique view showing the structure of the piezoelectric transducer comprised of a folded piezoelectric element of FIG. 14.

FIG. 15 is an oblique view showing the structure of the piezoelectric transducer 70 comprised of laminated and then folded piezoelectric elements. The laminated piezoelectric elements are consecutively folded so that the surface is alternately positioned on the inside and outside of the laminated piece. The upper surface electrode 72*a* of the piezoelectric element 72 and the lower electrode 71*b* of the piezoelectric element 71 are then electrically connected to comprise the first electrode 73 (=72*a*+71*b*). The resulting structure is normalized (baked). Wire leads are connected to the first electrode 73 and the common electrode 71*a*, a specified high direct current voltage applied to cause polarization and the fabrication of the piezoelectric transducer 70 as shown in FIG. 15 is now complete.

The material and the fabrication process of the piezoelectric elements 71 and 72 is the same as previously described for the configuration of the first embodiment so the detailed description is omitted here.

The piezoelectric transducer 70 of the shape shown in FIG. 15 can be substituted and used in place of the piezoelectric transducer 10 as previously described for the first embodiment.

In other words, when a sawtooth waveform pulse of some several hundred kilohertz is applied across the common electrode 71*a* and the first electrode 73 (72*a* and 71*b*) of the piezoelectric transducer 70, a reciprocating vibration of varying speeds is generated axially in the piezoelectric transducer 70, and just the same as explained for the first embodiment, a drive shaft (not shown in the drawing) secured tothepiezoelectrictransducer70 is madeto vibrate. A slider block friction coupled to the drive shaft is moved in the direction of the slower vibration by the asymmetrical motion from the reciprocating vibration of the drive shaft, and the driven member such as a table linked to the slider block can be moved.

Figure 16:
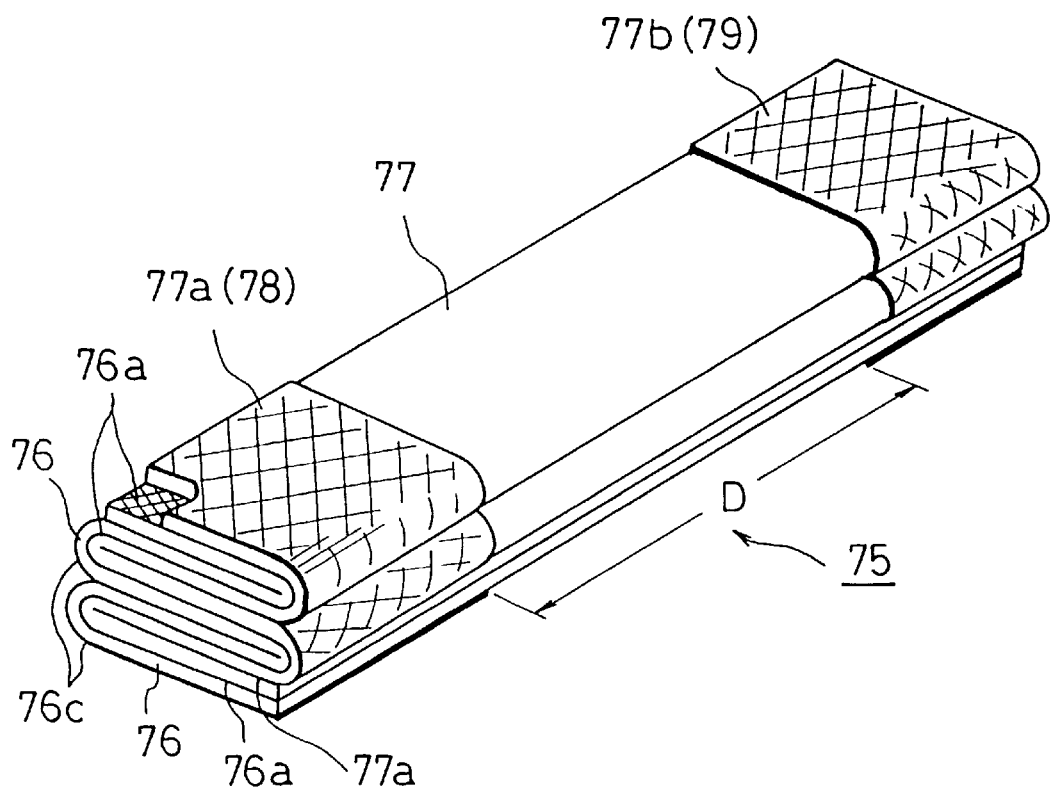
FIG. 16 is an oblique view showing another configuration of the piezoelectric transducer comprised of a folded piezoelectric element.

FIG. 16 is also an oblique view showing the structure of the piezoelectric transducer 75 comprised of a thin first piezoelectric element and a thin second piezoelectric element which are laminated and then folded.

Figure 17:
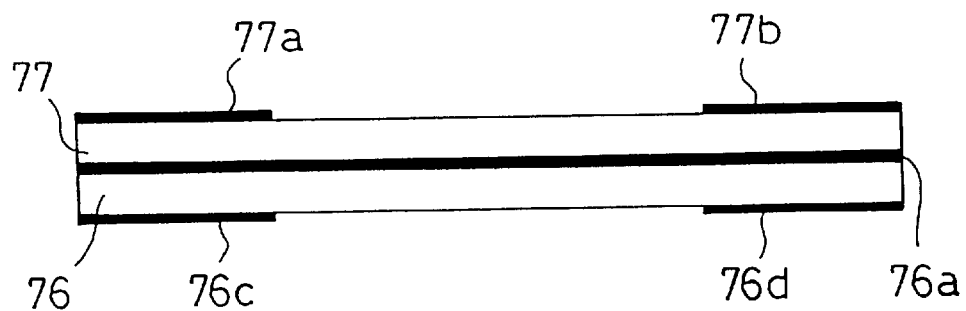
FIG. 17 is a cross sectional view illustrating the laminated structure of the piezoelectric element in FIG. 16.

In the configuration of this embodiment, a common electrode 76*a* is formed on the upper surface of the thin first piezoelectric element 76, and an electrode 76*c* and an electrode 76*d* are formed separated by a specified gap D on the lower surface of the piezoelectric element 76 as shown in the cross sectional view of the piezoelectric element in FIG. 17. Further, an electrode 77*a* and an electrode 77*b* are formed separated by a specified gap D on the upper surface of the thin second piezoelectric element 77.

The non-electrode side of the second piezoelectric element 77 faces the common electrode 76*a* of the first piezoelectric element 76 and is laminated and bonded on the piezoelectric element 76 (see FIG. 17) these laminated piezoelectric elements are consecutively folded so that their surface is alternately positioned on the inside and outside of the laminated piece (see FIG. 16). The upper surface electrode 77*a* of the second piezoelectric element 77 and the lower electrode 76*c* of the first piezoelectric element 76 are then electrically connected to comprise the first electrode 78 (=77*a*+76*c*), and the electrode 77*b* of the second piezoelectric element 77 and the lower surface electrode 76*d* of the piezoelectric element 76 are electrically connected to comprise the second electrode 79(=77*b*+76*d*).

These piezoelectric elements are normalized (baked) and wire leads connected to the first electrode 78, common electrode 76*a* and second electrode 79. A specified high DC current is applied across the first electrode 78 and common electrode 76*a*, and also across the second electrode 79 and common electrode 76*a* to cause polarization, and the fabrication of the piezoelectric transducer 75 as shown in FIG. 16 is now complete.

The piezoelectric transducer 75 of the shape shown in FIG. 16 can be substituted and used instead of the previously described piezoelectric transducer 30 of the second embodiment. The operation and applications are identical to those of the second embodiment so a description is omitted here.

Figure 18:
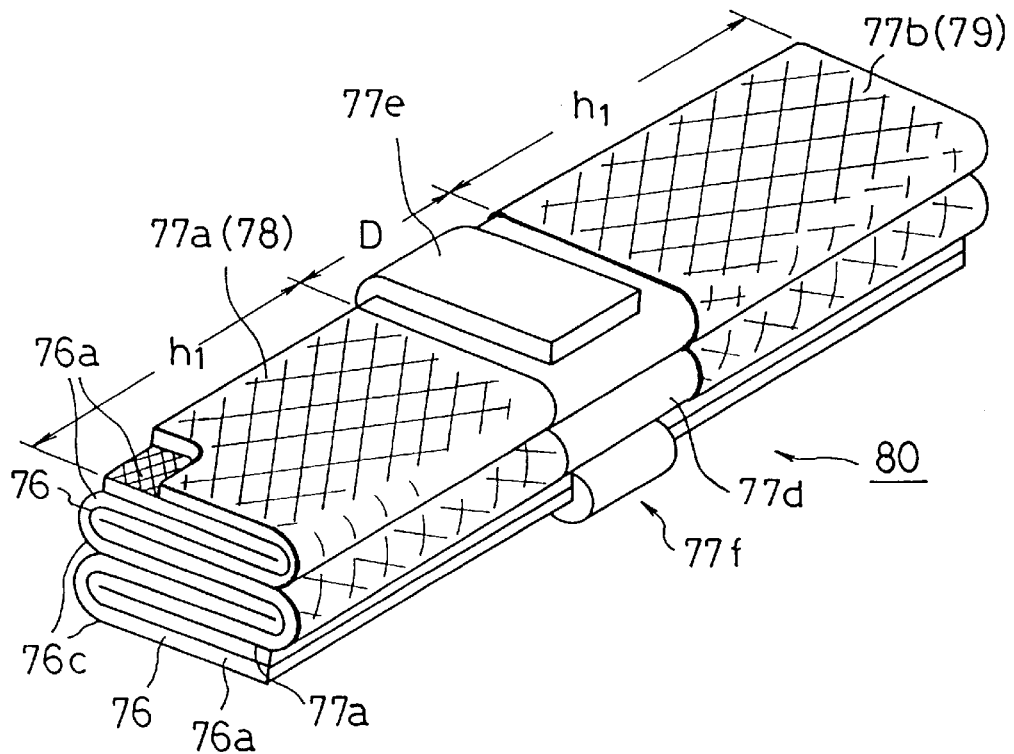
FIG. 18 is an oblique view showing another configuration of the piezoelectric transducer comprised of a folded piezoelectric element.

FIG. 18 is also an oblique view showing the structure of the piezoelectric transducer 80 comprised of a thin first piezoelectric element and a thin second piezoelectric element which are laminated and then folded comprising a structure similar to those in FIG. 16 and FIG. 17.

In the configuration of this embodiment, a common electrode 76*a* is formed on the upper surface of the thin first piezoelectric element 76, and an electrode 76*c* and an electrode 76*d* are formed separated by a specified gap D on the lower surface of the piezoelectric element 76. An electrode 77*a* and an electrode 77*b* are formed separated by a specified gap D on the upper surface of the thin second piezoelectric element 77. This configuration is similar to the previous configurations in FIG. 16 and FIG. 17.

However, the configuration shown in FIG. 18 differs from those in FIG. 16 and FIG. 17. That is, the width h1 for the electrodes 76*c* and electrode 76*d* formed separated by a specified gap D on the lower surface of the first piezoelectric element 76 and the width hi between the electrodes 77*a* and 77*b* formed separated by a specified distance h1 on the upper surface of the second piezoelectric element 77 is broader than the constitution shown in FIG. 16. Another difference is that an extension 77*e* is formed on the center section 77*d* of the second piezoelectric element 77 so that when the piezoelectric element is folded, a frictional coupling 77*f* with a large thickness can be formed in the center of the piezoelectric transducer 80. The frictional coupling 77*f* is frictionally coupled to the slider not shown in the drawing.

The piezoelectric transducer 80 of the shape shown in FIG. 18 can be substituted and used instead of the previously described piezoelectric transducer 40 of the third embodiment. Though not shown in FIG. 18, a slider such as denoted by reference numeral 47 (configuration of third embodiment) of FIG. 8, is friction coupled to the friction coupling 77*f* by an appropriate amount of frictional force, and an elongation or contraction displacement of the piezoelectric transducer 80 causes frictional coupling by the friction coupling 77*f* so the slider can move in a specified direction. The operation and applications are identical to those of the third embodiment and detailed description is omitted here.

Figure 19:
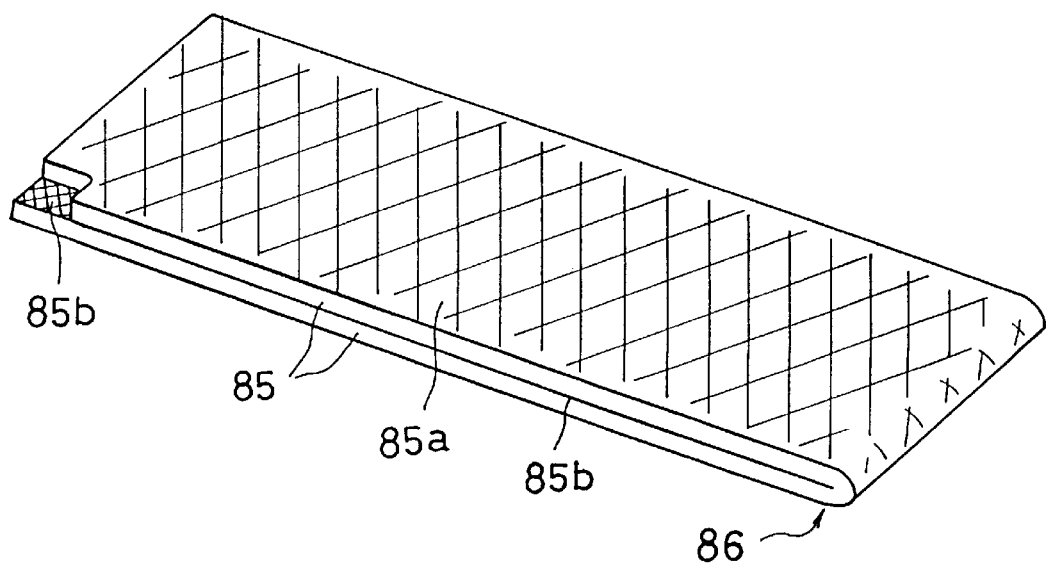
FIG. 19 is an oblique view shown another configuration of the laminated piezoelectric element.

FIG. 19 is an oblique view showing another structure of the piezoelectric element as shown in FIG. 14. That is, one thin piezoelectric element sheet is folded over on itself. In FIG. 19, an electrode 85*a* is formed on the front surface of that one thin piezoelectric element sheet 85 and an electrode 85*b* is formed on the rear face and this structure folded over at section 86. In a configuration of this type, just as previously explained for the configuration in FIG. 15, there is no need for a process to form an electrical connection between the upper surface electrode 72 of the piezoelectric element 72 and the lower surface electrode 71*b* of the piezoelectric element 71.

The configuration shown in FIG. 19 can of course be adapted to the piezoelectric transducers shown in FIG. 16 and FIG. 18 and is further adaptable to the piezoelectric transducers shown in FIG. 1 and FIG. 5.

Seventh Embodiment

The piezoelectric transducer of the seventh embodiment has a hollow tubular shape transducer.

Figure 20:
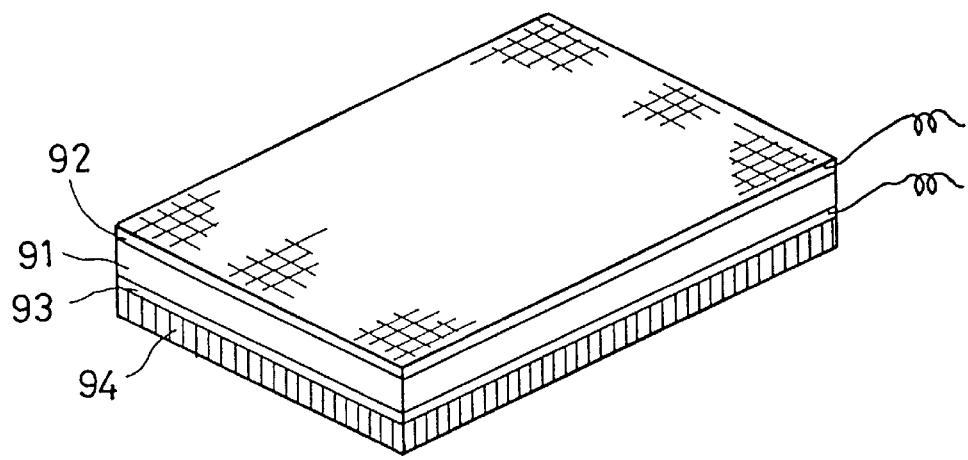
FIG. 20 is an oblique view showing the structure of the laminated piezoelectric element of the seventh embodiment.
Figure 21:
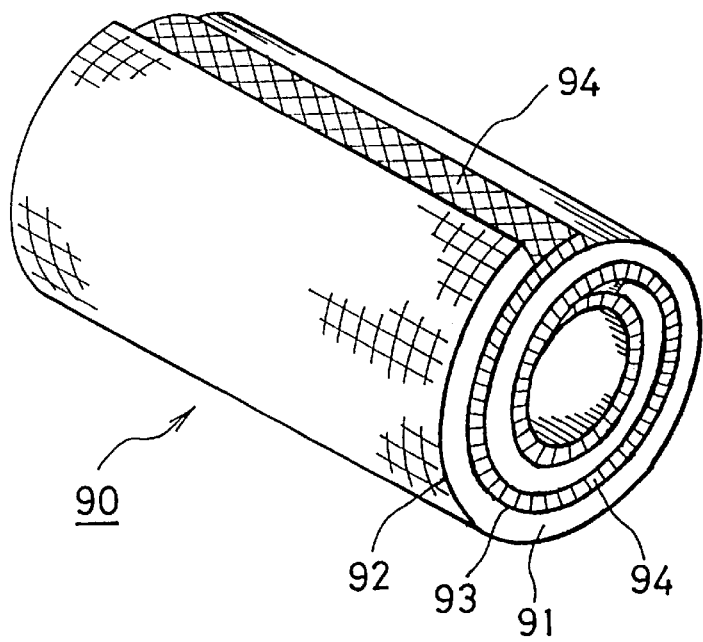
FIG. 21 is an oblique view of the exterior of the piezoelectric transducer of the seventh embodiment.
Figure 22:
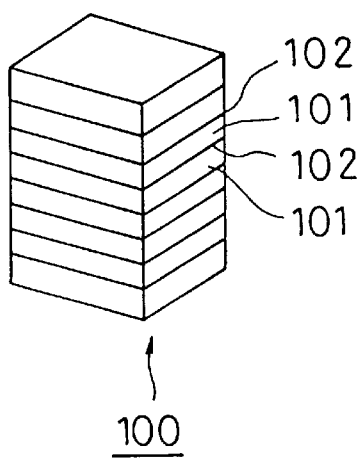
FIG. 22(a) is an oblique view showing the structure of the piezoelectric transducer of the conventional art comprising a plurality of laminated piezoelectric elements.
FIG. 22(b) is a side view showing the wiring of the piezoelectric transducer of the conventional art comprising a plurality of laminated piezoelectric elements.
Figure 22:
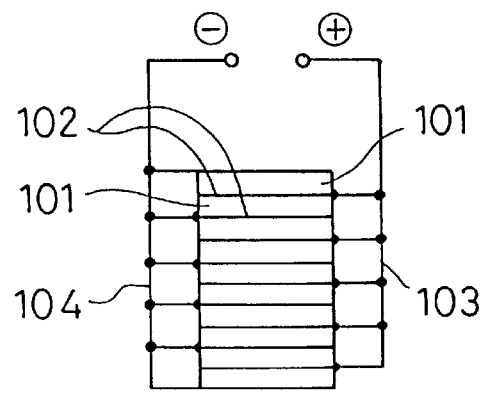

In FIG. 20, electrodes 92 and 93 are formed on the both side surfaces of the piezoelectric element 91, and an insulating sheet 94 is laminated and bonded on the electrode 93. Then, laminated sheet is wound to form a tubular shape as shown in FIG. 21.

The piezoelectric element formed in tubular shape is then normalized (baked), and wire leads connected to the electrodes 92 and 93, and when specific high DC voltage is applied for polarization, the fabrication of a piezoelectric transducer 10 is completed.

The material and the fabrication process of the piezoelectric element 91 is the same as previously described for the configuration of the first embodiment so the detailed description is omitted here.

In the above description, after the piezoelectric transducer of this invention, configured of a plurality of laminated sheets of thin piezoelectric elements has been wound in a tubular shape or folded, electrodes can be installed on the respective surfaces of each piezoelectric element, the elements laminated together and bonded, and a drastic reduction made in the former complicated process of installing wiring to the electrodes of each layer, so that not only can the cost of the fabrication process be greatly lowered but high mechanical strength is obtained even if the thickness of the individual piezoelectric elements are reduced in order to increase the intensity of the electrical field thus achieving a remarkable effect of the invention.

Further, a large motive power at a low voltage can be obtained from the actuator utilizing the piezoelectric transducer of this invention and an actuator having a high mechanical strength can also be provided.

What is claimed is:

1. An actuator utilizing a piezoelectric transducer, comprising:

a piezoelectric transducer formed by winding a laminated piece which has first and second piezoelectric elements including inorganic piezoelectric materials as a principal constituent, each having an electrode formed thereon;

a drive shaft secured to said piezoelectric transducer; and a driven member frictionally coupled to said drive shaft;

wherein said driven member is driven by reciprocating vibration of different speeds produced by applying drive pulses to said piezoelectric transducer.

2. An actuator utilizing a piezoelectric transducer, comprising:

a piezoelectric transducer formed by a laminated piece having first and second piezoelectric elements including inorganic piezoelectric materials as a principal constituent, each piezoelectric element having an electrode formed thereon, and said laminated piece is folded consecutively so that the top surface of the laminated piece is located on the outside and inside by turn, a drive shaft secured to said piezoelectric transducer; and a driven member frictionally coupled to said drive shaft, wherein said driven member is driven by reciprocating vibration of different speeds produced by applying drive pulses to said piezoelectric transducer.

3. An actuator utilizing a piezoelectric transducer, comprising:

a piezoelectric transducer formed by a laminated piece having a first piezoelectric element providing a first electrode divided into plural electrode regions and second piezoelectric element providing a second electrode, said piezoelectric element including inorganic piezoelectric materials as a principal constituent, said laminated piece is wound into a tube shape, and a plurality of electrode sections are constituted with said divided electrode regions and said second electrode; and a driven member frictionally coupled to said piezoelectric transducer;

wherein an elliptical vibration is produced in the piezoelectric transducer by the application of alternation current of different phases to said plurality of electrode sections respectively, thereby driving the driven member frictionally coupled to said piezoelectric transducer.

4. An actuator utilizing a piezoelectric transducer comprising:

a piezoelectric transducer formed by a laminated piece having a first piezoelectric element providing a first electrode divided into plural electrode regions and second piezoelectric element providing a second electrode, said piezoelectric element including inorganic piezoelectric materials as a principal constituent, said laminated piece is folded consecutively so that the top surface of the laminated piece is located on the outside and inside by turn, and a plurality of electrode sections are constituted with said divided electrode regions and said second electrode; and a driven member frictionally coupled to said piezoelectric transducer;

wherein an elliptical vibration is produced in the piezoelectric transducer by the application of alternation current of different phases to said plurality of electrode sections respectively, thereby driving the driven member frictionally coupled to said piezoelectric transducer.

* * * * *